United States Patent
Le Costaouec et al.

(10) Patent No.: US 10,563,717 B2
(45) Date of Patent: Feb. 18, 2020

(54) SYSTEMS AND METHODS FOR CARBON-CARBON MATERIALS INCORPORATING YTTRIUM AND ZIRCONIUM COMPOUNDS

(71) Applicant: Goodrich Corporation, Charlotte, NC (US)

(72) Inventors: Jean-Francois Le Costaouec, Pueblo West, CO (US); Paul Perea, Pueblo West, CO (US)

(73) Assignee: GOODRICH CORPORATION, Charlotte, NC (US)

( * ) Notice: Subject to any disclaimer, the term of this patent is extended or adjusted under 35 U.S.C. 154(b) by 77 days.

(21) Appl. No.: 15/951,417

(22) Filed: Apr. 12, 2018

(65) Prior Publication Data

US 2018/0231079 A1    Aug. 16, 2018

Related U.S. Application Data

(62) Division of application No. 14/974,179, filed on Dec. 18, 2015, now Pat. No. 9,970,497.

(51) Int. Cl.
*F16D 65/12* (2006.01)
*F16D 69/02* (2006.01)
(Continued)

(52) U.S. Cl.
CPC ............ *F16D 65/126* (2013.01); *C04B 35/52* (2013.01); *C04B 35/521* (2013.01);
(Continued)

(58) Field of Classification Search
CPC .... D06M 23/08; F16D 69/028; F16D 65/126; F16D 55/24; C04B 2235/616;
(Continued)

(56) References Cited

U.S. PATENT DOCUMENTS 4,465,581 A    8/1984   Juel et al.
5,759,688 A    6/1998   Lee
(Continued)

FOREIGN PATENT DOCUMENTS

CN    105016759    11/2015
GB    2151221      7/1985
(Continued)

OTHER PUBLICATIONS

R.Koc and D.B. Hodge, Production of TiB2 from a precursor containing carbon coated TiO2 and B4C, Journal of materials science letters 19 (2000), pp. 667-669, Kluwer Academic Publishers.

(Continued)

*Primary Examiner* — Robert A. Siconolfi
*Assistant Examiner* — San M Aung
(74) *Attorney, Agent, or Firm* — Snell & Wilmer, L.L.P.

(57) ABSTRACT

A method of treating a carbon structure is provided. The method may include the step of infiltrating the carbon structure with a ceramic preparation comprising yttrium oxides and zirconium oxides. The carbon structure may be densified by chemical vapor infiltration (CVI) and heat treated to form yttrium oxycarbides and/or carbides and zirconium oxycarbides and/or carbides. Heat treating the carbon structure may comprise a temperature ranging from 1000° C. to 1600° C.

3 Claims, 4 Drawing Sheets

(51) Int. Cl.

| | | |
|---|---|---|
| *D06M 23/08* | (2006.01) | |
| *C04B 35/52* | (2006.01) | |
| *C23C 16/04* | (2006.01) | |
| *C04B 35/628* | (2006.01) | |
| *C23C 16/56* | (2006.01) | |
| *D01F 11/12* | (2006.01) | |
| *D06M 11/74* | (2006.01) | |
| *D06M 11/45* | (2006.01) | |
| *D06M 11/46* | (2006.01) | |
| *C04B 41/00* | (2006.01) | |
| *C04B 41/45* | (2006.01) | |
| *F16D 55/24* | (2006.01) | |
| *D01F 9/12* | (2006.01) | |
| *D06M 101/40* | (2006.01) | |

(52) U.S. Cl.
CPC .. *C04B 35/62839* (2013.01); *C04B 35/62886* (2013.01); *C04B 41/0072* (2013.01); *C04B 41/4529* (2013.01); *C23C 16/045* (2013.01); *C23C 16/56* (2013.01); *D01F 11/123* (2013.01); *D06M 11/45* (2013.01); *D06M 11/46* (2013.01); *D06M 11/74* (2013.01); *D06M 23/08* (2013.01); *F16D 55/24* (2013.01); *F16D 69/028* (2013.01); *C04B 2235/3225* (2013.01); *C04B 2235/3244* (2013.01); *C04B 2235/424* (2013.01); *C04B 2235/5445* (2013.01); *C04B 2235/614* (2013.01); *C04B 2235/616* (2013.01); *C04B 2235/80* (2013.01); *D01F 9/12* (2013.01); *D06M 2101/40* (2013.01)

(58) Field of Classification Search
CPC ..... C04B 35/48; C04B 35/486; C04B 35/488; C04B 35/56; C04B 35/5603; C04B 35/5622
USPC ........................................ 188/71.5
See application file for complete search history.

(56) References Cited

U.S. PATENT DOCUMENTS

| | | | |
|---|---|---|---|
| 5,962,135 A | 10/1999 | Walker et al. | |
| 6,068,925 A | 5/2000 | Wilson | |
| 6,277,440 B1* | 8/2001 | Reynolds | C04B 35/806 427/226 |
| 8,268,393 B2 | 9/2012 | Rollin et al. | |
| 8,337,799 B2 | 12/2012 | Bogicevic et al. | |
| 8,357,623 B2 | 1/2013 | Lillo et al. | |
| 8,858,846 B2 | 10/2014 | Simpson et al. | |
| 8,865,301 B2 | 10/2014 | Keller et al. | |
| 8,871,044 B2 | 10/2014 | Baud et al. | |
| 2005/0040004 A1 | 2/2005 | Kienzle et al. | |
| 2007/0128421 A1 | 6/2007 | Lee | |
| 2007/0178163 A1 | 8/2007 | Kodas | |
| 2007/0235270 A1* | 10/2007 | Miskinis | F16D 65/0006 188/218 XL |
| 2008/0241446 A1* | 10/2008 | Adzima | B28B 23/0006 428/34.5 |
| 2008/0311301 A1 | 12/2008 | Diss et al. | |
| 2010/0015332 A1 | 1/2010 | Rollin | |
| 2010/0202956 A1 | 8/2010 | Bogicevic et al. | |
| 2010/0291373 A1* | 11/2010 | Baud | C04B 35/83 428/325 |
| 2011/0124253 A1 | 5/2011 | Shah et al. | |
| 2013/0337180 A1* | 12/2013 | Jacquemard | C04B 35/83 427/372.2 |
| 2015/0376064 A1 | 12/2015 | Chung | |
| 2017/0002458 A1 | 1/2017 | Le Costaouec et al. | |

FOREIGN PATENT DOCUMENTS

| | | |
|---|---|---|
| GB | 2444927 | 6/2008 |
| GB | 2444927 A * | 6/2008 |

OTHER PUBLICATIONS

Extended European Search Report dated Dec. 2, 2016 in European Application No. 16177754.5.
Extended European Search Report dated Apr. 20, 2017 in European Application No. 16205090.0.
Gendre, et al., "Synthesis of zirconium oxycarbide (ZrCO) powders: Influence of stoichiometry on densification kinetics during spark plasma sintering and on mechanical properties," Journal of the European Ceramic Society, ELsevier Science Publishers, Essex, GB, vol. 31, No. 13, May 25, 2011, pp. 2377-2385.
Notice of Allowance dated Jun. 12, 2017 in U.S. Appl. No. 14/790,996.
First Action Interview Office Action dated Mar. 28, 2017 in U.S. Appl. No. 14/790,996.
Preinterview First Office Action dated Feb. 6, 2017 in U.S. Appl. No. 14/790,996.
Smeacetto, et al., "Oxidation protective multilayer coatings for carbon-carbon composites," Carbon, vol. 40, 2002, pp. 583-587.
Jimbou, et al., "New composite composed of boron carbide and carbon fiber with high thermal conductivity for first wall," Journal of Nuclear Materials, 233-237, 1996, pp. 781-786.
USPTO; Restriction Requirement Office Action dated Jun. 5, 2017 in U.S. Appl. No. 14/974,179.
USPTO; Pre-Interview first Office Action dated Dec. 20, 2017 in U.S. Appl. No. 14/974,179.
USPTO; Notice of Allowance dated Feb. 27, 2018 in U.S. Appl. No. 14/974,179.
European Patent Office, European Search Report dated May 27, 2019 in Application No. 16205090.0.

* cited by examiner

SYSTEMS AND METHODS FOR CARBON-CARBON MATERIALS INCORPORATING YTTRIUM AND ZIRCONIUM COMPOUNDS

CROSS-REFERENCE TO RELATED APPLICATIONS

This application is a Divisional of, and claims priority to and the benefit of, U.S. application Ser. No. 14/974,179, entitled "SYSTEMS AND METHODS FOR CARBON-CARBON MATERIALS INCORPORATING YTTRIUM AND ZIRCONIUM COMPOUNDS," filed on Dec. 18, 2015, which is incorporated herein in its entirety.

FIELD

The present disclosure relates to carbon composites, and, more specifically, to a method of forming carbon composites.

BACKGROUND

Aircraft brakes may comprise carbon brake components. The brake system rotor friction disks, stator friction disks, pressure plates, and end plates, for example, may be comprised of carbon fiber and pyrolytic composite materials. Brake system rotor friction disks and stator friction disks comprising carbon fiber composite materials may exhibit varying wear characteristics resulting in part from the materials used in construction and heat treatments applied. Brake components with poor wear characteristics may have relatively short product lives and be associated with more frequent maintenance or replacement.

SUMMARY

In various embodiments, a method for treating a carbon structure may comprise forming a carbon structure and treating the carbon structure with heat at a first temperature ranging from 1000° C. to 2200° C. In various embodiments, the method may comprise infiltrating the carbon structure with a ceramic preparation comprising yttrium oxides and zirconium oxides, densifying the carbon structure by chemical vapor infiltration (CVI), and heat treating the carbon structure to form a plurality of ceramic particles in the carbon structure comprising zirconium oxycarbide, zirconium carbide, yttrium oxycarbide, and/or yttrium carbide. The ceramic preparation may comprise yttria-stabilized zirconia as the source of the yttrium oxides and zirconium oxides. The ceramic preparation may be a colloidal suspension and/or a sol gel. In various embodiments, the method may further comprise partially densifying the carbon structure before and/or after infiltrating the carbon structure with the ceramic preparation, forming a partially densified carbon structure. The method may further comprise infiltrating a partially densifying carbon structure with the ceramic preparation. In various embodiments, the method may further comprise adding a polyelectrolyte dispersant to the ceramic preparation to coat the yttria-stabilized zirconia with a carbon film. The method may further comprise adding a carbon source to the ceramic preparation which may comprise polyvinyl alcohol, polyacrylamide, polyvinylpyrrolidone, polyvinyl acetate, polytheyleneimine, polyacrylate, carbon black, and/or an aqueous emulsion of polyester, epoxy, and/or phenolic. The plurality of ceramic particles after heat treating the carbon structure may comprise, by weight, 0.5% to 12% of the carbon structure, and each ceramic particle may comprise a size of less than 500 nanometers. Heat treating the carbon structure may comprise a temperature ranging from 1000° C. to 1600° C.

In various embodiments, a disk brake system may comprise a plurality of friction disks, wherein each friction disk in the plurality of friction disks is comprised of a carbon structure comprising a plurality of ceramic particles in the carbon structure, the plurality of ceramic particles comprising zirconium oxycarbide, zirconium carbide, yttrium oxycarbide, and/or yttrium carbide. The plurality of ceramic particles may comprise, by weight, 0.5% to 12% of the carbon structure and each ceramic particle may comprise a size of less than 500 nanometers.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the figures, wherein like numerals denote like elements.

DETAILED DESCRIPTION

All ranges and ratio limits disclosed herein may be combined. It is to be understood that unless specifically stated otherwise, references to "a," "an," and/or "the" may include one or more than one and that reference to an item in the singular may also include the item in the plural.

The detailed description of exemplary embodiments herein makes reference to the accompanying drawings, which show exemplary embodiments by way of illustration, and not of limitation. While these exemplary embodiments are described in sufficient detail to enable those skilled in the art to practice the exemplary embodiments of the disclosure, it should be understood that other embodiments may be realized and that logical changes and adaptations in design and construction may be made in accordance with this disclosure and the teachings herein. Thus, the detailed description herein is presented for purposes of illustration only and not limitation. The steps recited in any of the method or process descriptions may be executed in any order and are not necessarily limited to the order presented. Moreover, many of the functions or steps may be outsourced to or performed by one or more third parties. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Figure 1:
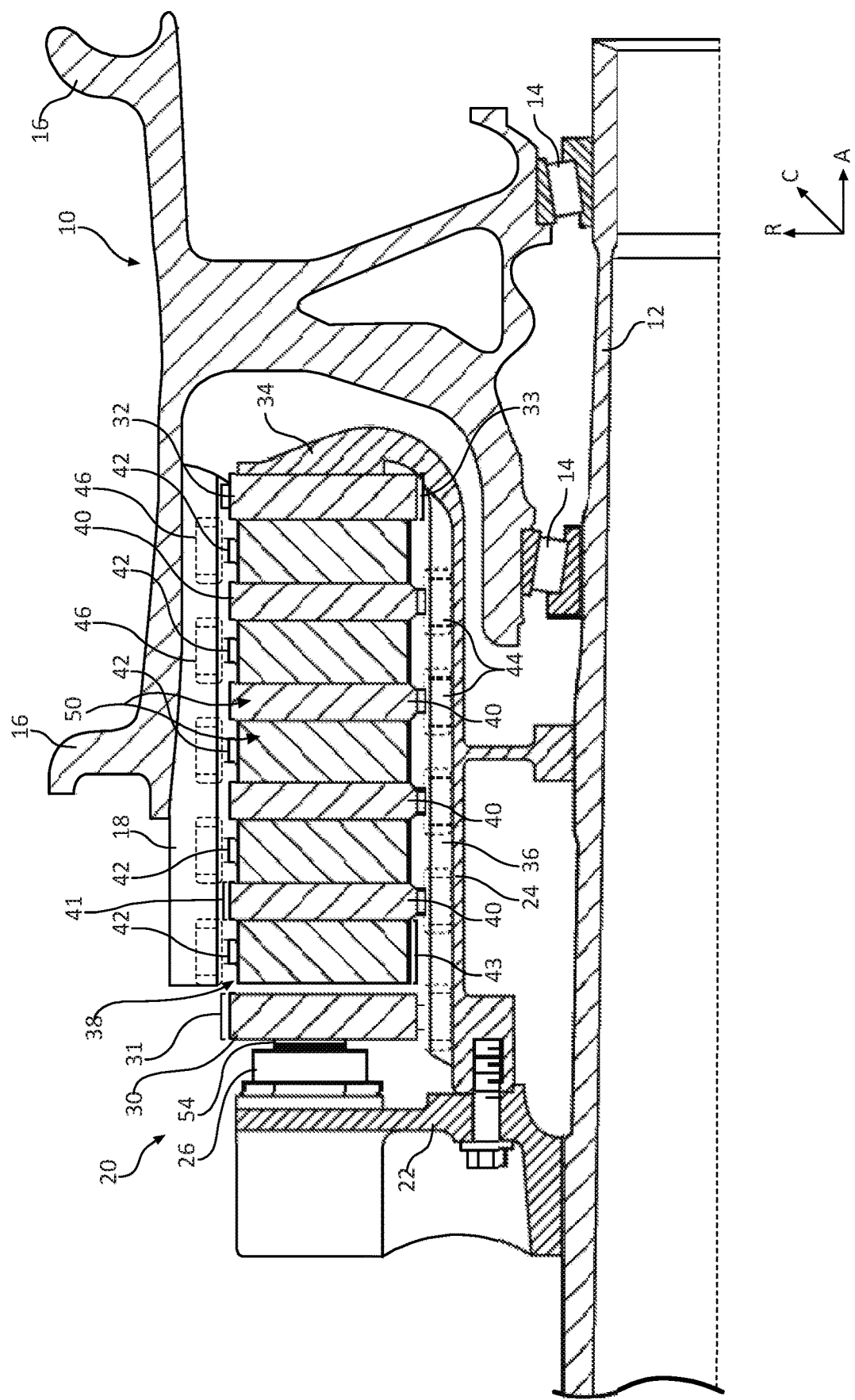
FIG. 1 illustrates a disk brake system, in accordance with various embodiments.

With reference to FIG. 1, a disk brake system 20 is illustrated. In various embodiments, the disk brake system 20 may be used to reduce the speed of a wheel of an aircraft. An A-R-C axis has been included in the drawings to illustrate the axial (A), radial (R) and circumferential (C) directions. The system may include a wheel 10 supported for rotation around an axle 12 by bearings 14. The wheel 10 includes rims 16 for supporting a tire, and a series of axially extending rotor splines 18 (one shown). Rotation of the wheel 10 is modulated by the disk brake system 20. The disk brake system 20 includes a torque flange 22, a torque tube 24, a plurality of pistons 26 (one shown), a pressure plate 30, and an end plate 32. In various embodiments, the pressure plate 30 and the end plate 32 are annular disks. The torque tube 24 is an elongated annular structure that includes a reaction plate 34 and a series of axially extending stator splines 36 (one shown). The reaction plate 34 and stator splines 36 may be integral with the torque tube 24 as shown in FIG. 1, or attached as separate components.

In accordance with various embodiments, the disk brake system 20 also includes a plurality of friction disks 38. The plurality of friction disks 38 includes at least one non-rotatable friction disk, also known as a stator friction disk 40, and at least one rotatable friction disk, also known as a rotor friction disk 42. Each of the plurality of friction disks 38 includes an attachment structure. As shown in FIG. 1, each of four stator friction disks 40 include a plurality of stator lugs 44 at circumferentially spaced positions around the stator friction disk 40 as an attachment structure. Similarly, each of five rotor friction disks 42 include a plurality of rotor lugs 46 at circumferentially spaced positions around the rotor friction disk 42 as an attachment structure. In various embodiments, and as shown in FIG. 1, the pressure plate 30, end plate 32, and friction disks 38 are all annular disks.

The torque flange 22 is mounted to the axle 12. The torque tube 24 is bolted to the torque flange 22 such that the reaction plate 34 is near an axial center of the wheel 10. The end plate 32 is connected to a surface of the reaction plate 34 facing axially away from the axial center of the wheel 10. Thus, the end plate 32 is non-rotatable by virtue of its connection to the torque tube 24. The stator splines 36 support the pressure plate 30 so that the pressure plate 30 is also non-rotatable. The stator splines 36 also support the stator friction disks 40. The stator friction disks 40 engage the stator splines 36 with gaps formed between the stator lugs 44. Similarly, the rotor friction disks 42 engage the rotor splines 18 with gaps formed between the rotor lugs 46. Thus, the rotor friction disks 42 are rotatable by virtue of their engagement with the rotor splines 18 of the wheel 10.

As shown in FIG. 1, the rotor friction disks 42 are arranged with the end plate 32 on one end (having an end plate thickness 33), the pressure plate 30 on the other end (having a pressure plate thickness 31), and the stator friction disks 40 (each having a stator thickness 41) interleaved so that the rotor friction disks 42 (each having a rotor thickness 43) are adjacent to non-rotatable friction components. In various embodiments, the number of rotor friction disks 42 and stator friction disks 40 may vary according to the brake assembly design. The pistons 26 are connected to the torque flange 22 at circumferentially spaced positions around the torque flange 22. The pistons 26 face axially toward the wheel 10 and include pucks 54 that contact a side of the pressure plate 30 opposite the rotor friction disks 42. The pistons 26 may be powered electrically, hydraulically or pneumatically.

In various embodiments, prior to operation of the disk brake system 20, pistons 26 are not actuated and gaps exist between each of rotor friction disks 42 and each of the non-rotatable friction components, namely pressure plate 30, end plate 32, and stator friction disks 40. The gaps are formed by the axial spreading out of the rotor friction disks 42 along the rotor splines 18; and the stator friction disks 40, and the pressure plate 30 along the stator splines 36 due to the movement of the rotor friction disks 42 adjacent to the non-rotatable friction components. During operation of the disk brake system, pistons 26 are actuated, forcing the pressure plate 30 to move along stator splines 36 against the plurality of the friction disks 38, forcing them axially toward the end plate 32 and reaction plate 34. Squeezed between the pressure plate 30 and the reaction plate 34, the gaps are eliminated as friction surfaces contact other friction surfaces.

The friction disks 38 of the disk brake system 20 may be comprised of carbon structures comprising carbon composite material. Contact between friction disks 38 during operation of the disk brake system 20 as described above causes the friction disks 38 to wear over time. In various embodiments, in order to improve the wear rate of the friction disks 38, ceramic particles may be incorporated into the carbon materials during the fabrication process of the carbon composite material comprised in the friction disks 38.

In various embodiments, it may be desirable to incorporate the hard ceramic particles into the carbon structure to improve the wear rate of the carbon composite material comprised in friction disks 38. Particles comprising zirconium compounds, such as zirconium oxycarbides and zirconium carbides, for example, may be incorporated into wear products such as friction disks 38, to improve wear rate. Zirconium compounds are suitable for this purpose in part because of the abundance and affordability of zirconium raw materials. In various embodiments, yttrium compounds may be introduced to the carbon structure during the fabrication process. Yttrium compounds are hard, dense compounds (in various physical forms), and therefore, the addition of particles comprising yttrium compounds may provide better wear properties for the friction disks 38 than zirconium particles alone. Yttrium raw materials are typically rarer and, thus, more expensive than zirconium raw materials, especially in fine particle size powders or suspensions of zirconium raw materials.

Yttria-stabilized zirconia powders and/or suspensions have become commercially available at an affordable cost. In various embodiments, dense zirconia products may be manufactured with a doping agent, such as yttrium oxide, to stabilize the zirconia. In various embodiments, the hardness and wear rate of the carbon composite material in the friction disks 38 may be increased and improved by incorporating yttria-stabilized zirconia into the carbon structure during the fabrication process of the friction disks 38. After densification, the carbon structure comprising the carbon composite material 50 of the friction disks 38 may be left with a plurality of ceramic particles to increase hardness and improve wear rate. By using yttria-stabilized zirconia, the carbon composite material 50 of the friction disks 38 may comprise ceramic particles of one or more of zirconium oxycarbide, zirconium carbide, yttrium oxycarbide and/or yttrium carbide. In various embodiments, the carbon composite material 50 of the friction disks 38 may comprise residual yttria-stabilized zirconia. The various combinations of zirconium particles and yttrium particles tend to improve the wear rate. While not desiring to be bound by theory, it is thought that this effect is because of the added hardness and density from yttrium oxycarbide and yttrium carbide particles.

In various embodiments, in each of the friction disks 38, the plurality of ceramic particles, including zirconium oxycarbide, zirconium carbide, yttrium oxycarbide, and/or yttrium carbide, and possibly residual yttria-stabilized zirconia, in the carbon composite material 50 may comprise 0.5% to 12% of the finished carbon-carbon structure, by weight. In various embodiments, each ceramic particle in the carbon composite material 50 of the friction disks 38 may comprise a size of less than 500 nanometers.

The processes disclosed herein may include treatments for producing carbon fiber reinforced carbon composite material. Thus, as used herein the term "carbon structure" may be used to describe a carbon preform, a carbon fiber reinforced carbon material at various stages of densification, a carbon structure prior to densification and carbon reinforcement, and/or a finished carbon composite material.

The processes for treating carbon structures disclosed herein further include infiltration of a ceramic preparation, comprising ceramic particles having zirconium oxides and yttrium oxides, into a carbon structure to prepare the carbon structure. In various embodiments, the ceramic particles may have zirconium oxides and yttrium oxides that are in a combined state at the particle level and/or molecular level, for example, in particles comprising yttria-stabilized zirconia. In various embodiments, the ceramic particles may have zirconium oxides and yttrium oxides that are not in a combined state at the particle level and/or molecular level, and instead the zirconium oxides and yttrium oxides may be in a separated state. As used herein, ceramic preparation describes a ceramic suspension, which may be a colloidal suspension, and/or a ceramic sol gel for infiltration into a carbon structure.

Figure 2:
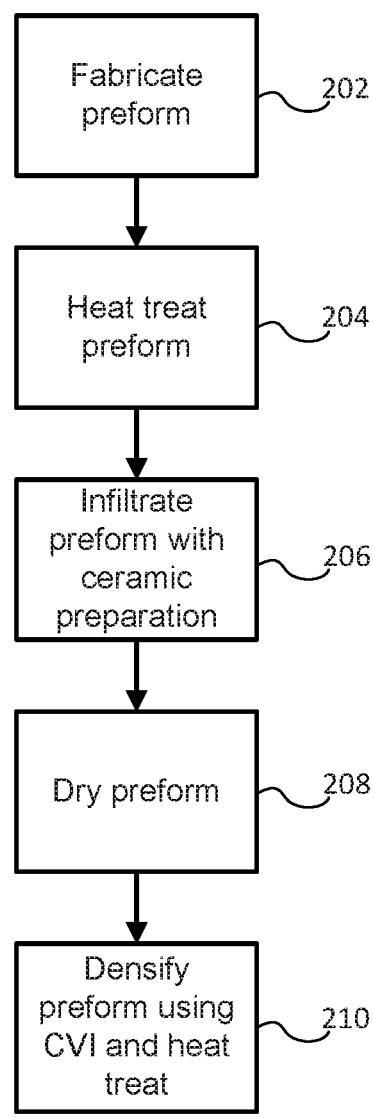
FIG. 2 illustrates a process for forming carbon components with a single application of ceramic material followed by multiple chemical vapor infiltration (CVI) densification steps, in accordance with various embodiments.

With reference to FIG. 2, a process 200 for treating a carbon fiber reinforced carbon structure is shown, in accordance with various embodiments. A fiber preform may be fabricated (Step 202). The fiber preform or carbon structure may comprise a porous structure. A porous structure may comprise any porous structure derived from a fibrous material such as carbon fibers or the like. The carbon fibers may be derived from polyacrylonitrile (PAN), rayon (synthetic fiber derived from cellulose), pitch, or the like. The starting fiber may be pre-oxidized PAN or fully carbonized commercial carbon fiber. The fibrous preform is preferably prepared using needling of individual textile layers. The individual brake preform may be fabricated using a net shape preforming technology or may be cut from a needled board. Alternatively, preforms may be a 2D lay-up of woven, braided or knitted fabric. The fibrous material may be in the form of chopped carbon fibers molded to form a preform. Prior to the densification process, the fibrous material may be formed into a preform having any desired shape or form. For example, the porous structure may be in the form of a disk having any shape such as, for example, a polygon, a cylinder, a triangle, annular, square, rectangle, pentagon, hexagon, octagon, or the like. In addition, the porous structure may have an irregular form.

In various embodiments, the preform may be heat treated (Step 204) at temperatures between 1000° C. and 2200° C. Heat treatments described herein may vary in temperatures and durations.

In various embodiments, the preform may be infiltrated with a ceramic preparation that is at least one of a ceramic colloidal suspension or sol gel solution prepared with a selected ceramic content of yttrium compounds and zirconium compounds (Step 206). In various embodiments, the yttrium compounds and zirconium compounds may be combined at the particle level, for example, in particles comprising yttria-stabilized zirconia. For example, an aqueous colloidal suspension comprising yttria-stabilized zirconium compounds, such as $Y_2O_3$—$ZrO_2$, may be introduced in the carbon composite as described in detail below. The starting ceramic powders may comprise ceramic particles of yttria-stabilized zirconia having various sizes, for example, sizes ranging from 40 nanometers to 60 nanometers ($1.57e^{-6}$ inches to $2.36e^{-6}$ inches), or from 10 nanometers to 13 nanometers ($3.9e^{-7}$ inches to $5.1\ e^{-7}$ inches).

In various embodiments, the incorporation of a controlled starting amount of very fine ceramic particles, comprising particle sizes described herein, throughout the carbon composite may lead to the formation of very fine yttrium and zirconium compounds following subsequent heat treatments and further carbon densification cycles, comprising sizes below 500 nanometers ($2.0e^{-5}$ inches). Additives such as a wetting agent are made to the ceramic suspension to facilitate wetting of the preform or of the partially densified carbon structure. During subsequent heat treatments of the carbon structure under an inert atmosphere at temperatures greater than 1100° C., carbo-thermal reduction of yttrium oxides and zirconium oxides may occur, yielding zirconium oxycarbide, zirconium carbide, yttrium oxycarbide, and/or yttrium carbide compounds. In various embodiments, residual yttrium oxides and zirconium oxides, which may be combined as yttria-stabilized zirconia, may remain after the heat treatments.

In various embodiments, it may be advantageous to provide an additional source of carbon to the colloidal ceramic suspension or sol gel solution to control the grain size of the particles comprising zirconium oxides and/or yttrium oxides, which may be combined in yttria-stabilized zirconia, for example, during the carbo-thermal reduction of the yttrium oxides and zirconium oxides. This may be accomplished by adding a carbon compound to the starting suspension in the form of one or several water soluble polymers such as a polyvinyl alcohol (PVA), polyvinylpyrrolidone (PVP), polyvinyl acetate, poly (2-oxazoline), polyacrylamide (PAM), polyethyleneimine (PEI), and/or polyacrylate (PAA). An aqueous emulsion of polyester, epoxy, or phenolic may be also used. Aqueous carbon black dispersions may be used as the additional carbon source, or to supplement a water-soluble polymer. These carbon sources exhibit various char yields and may be introduced in the form of one or more components. Prior to adding the additional carbon compound to the ceramic suspension, the pH of the ceramic suspension may be adjusted. For example, the pH of the ceramic suspension may be made more basic by adding ammonium hydroxide or other similar Arrhenius base.

In various embodiments, effectiveness of the carbon addition may be improved by pursuing the individual carbon coatings of the ceramic particles comprising yttrium oxides and/or zirconium oxides, which may be in a combined state in, for example, yttria-stabilized zirconium. Encapsulation of the ceramic particles with a thin polymeric layer of carbon during the preparation of the suspension may be accomplished by the addition of a polyelectrolyte dispersant or organic acid, such as citric acid, trans-aconitic acid, or cis-aconitic acid, into the ceramic suspension, which absorbs and coats the ceramic particles. The type and amount of polyelectrolyte may be chosen to provide a sufficient carbon char yield upon heat treatment in an inert atmosphere. In various embodiments, dispersants include ammonium polyacrylates, polyethyleneimine, and/or polyacrylamide. In response to subsequent processing, the absorbed layer of polymer may be pyrolyzed into a carbon film.

In various embodiments, the addition of an aqueous carbon black dispersion and/or additional water soluble polymer to the colloidal ceramic suspension may take place to achieve a greater amount of carbon. The addition of an aqueous carbon black dispersion and/or additional water soluble polymer to the colloidal ceramic suspension may take place following the formation of an adsorbed polymer layer on the ceramic particles from the polyelectrolyte dispersant or organic acid, or the carbon black dispersion and/or the water soluble polymer may be the only source of carbon in the ceramic preparation.

In various embodiments, the polymer may take different forms. The polymer may be a non-ionic polymer like PVA, PAM, an aqueous emulsion of polyester, epoxy, or phenolic, or a combination of two or more of the polymers. The molecular weight and quantity of polymer may be chosen to maintain the overall viscosity of the colloidal suspension low in order to facilitate its infiltration within the carbon composite.

In various embodiments, the aqueous ceramic suspension may be prepared from dry ceramic powder, comprising yttria-stabilized zirconia, and/or already suspended yttria-stabilized zirconia particles. The zirconia particles may be partially or fully stabilized by yttria, depending on the amount of yttria incorporated into the zirconia compounds. Zirconia particles partially stabilized by yttria may comprise uniform dispersion of 3 mol % of yttria, or about 5.2% by weight, wherein the term "about" in this context only refers to plus or minus 0.2%. Zirconia that is fully stabilized by yttria may comprise 4, 6, 8, and/or 10 mol % content, or about 7, 10.3, 13.3, and 15.9% by weight, respectively, wherein the term "about" in this context only refers to plus or minus 0.2%. For example, in preparing an aqueous ceramic suspension, a dry ceramic powder comprising agglomerated ceramic granules of yttria-stabilized zirconia, and/or an yttria-stabilized zirconia suspension, may be added to distilled water. The ceramic suspension may be dispersed using a high energy mixer, such as an attrition mill of a high shear mixer, in order to break down the ceramic granules to their elementary nanosize original states. The ceramic suspension may be further de-agglomerated using ultrasounds. A wetting agent may be added to facilitate wetting of the preform and or partially densified carbon structure. The pH of the ceramic suspension may be raised to a level at or between 10 and 11 using ammonium hydroxide, which may comprise 0.3% of ammonium polyacrylate polyelectrolyte.

Ceramic colloidal suspensions comprising yttrium oxides and zirconium oxides may be prepared using various materials. In various embodiments, a dry ceramic powder comprising 10% by weight of yttria-stabilized zirconia ($Y_2O_3$—$ZrO_2$, with 16% $Y_2O_3$ by weight) may be added to distilled water comprising 0.2% ammonium polyacrylate polyelectrolyte. The ceramic powder may be made of nanosize particles, which may be available in agglomerated granules to limit the health hazard associated with the handling of nanosize powder. The ceramic granules comprised in the ceramic powder may be dispersed using a high energy mixer, such as an attrition mill of a high shear mixer, in order to de-agglomerate the ceramic granules to their elementary nanosize original states. The pH of the solution may be increased to at or between 10 and 11 by adding ammonium hydroxide. Non-ionic aqueous nano carbon black, having a pH at or between 9 and 11, may be added and mixed into the ceramic suspension. The amount of added carbon black may correspond to a ratio of carbon/yttria-stabilized zirconia of 0.29, or 2.8% of the total ceramic suspension. The ceramic suspension may further be de-agglomerated using ultrasounds.

In various embodiments, a dry ceramic powder comprising 21% by weight of yttria-stabilized zirconia ($Y_2O_3$—$ZrO_2$, with 5.2% $Y_2O_3$ by weight) may be added to distilled water comprising 2% citric acid polyelectrolyte. The pH of the solution may be increased to at or between 10 and 11 by adding ammonium hydroxide. The ceramic granules comprised in the ceramic powder may be dispersed using a high energy mixer, such as an attrition mill of a high shear mixer, in order to de-agglomerate the ceramic granules to their elementary nanosize original state. Non-ionic aqueous nano carbon black, comprising a particle size of 30 nanometers (1.2e-6 inches) and having a pH at or between 9 and 11, may be added and mixed into the ceramic suspension. The amount of added carbon black may correspond to a ratio of carbon/yttria-stabilized zirconia of 0.22. The ceramic suspension may further be de-agglomerated using ultrasounds.

In various embodiments, a ceramic colloidal suspension comprising 25% by weight of yttria-stabilized zirconia ($Y_2O_3$—$ZrO_2$, with 16% $Y_2O_3$ by weight) may be added to distilled water to produce a 15% by weight yttria-stabilized zirconia loading suspension. The pH of the solution may be increased from 5 to 11 by adding ammonium hydroxide with 0.3% ammonium polyacrylate polyelectrolyte. The ceramic suspension may be dispersed using a high energy mixer, such as an attrition mill of a high shear mixer. Non-ionic aqueous nano carbon black, which may comprise 35.5% by weight of carbon black and may have a pH at or between 9 and 11, may be added and mixed into the ceramic suspension. The amount of added carbon black may correspond to a ratio of carbon/yttria-stabilized zirconia of 0.18. The ceramic suspension may further be de-agglomerated using ultrasounds.

In various embodiments, a ceramic colloidal suspension comprising 25% by weight of yttria-stabilized zirconia ($Y_2O_3$—$ZrO_2$, with 13.6% $Y_2O_3$ by weight) may be added to distilled water, polyelectrolyte, PVA, and carbon black to produce a 6% by weight yttria-stabilized zirconia loading suspension. The ceramic suspension may comprise 1.1% PVA and 1% carbon black (dry weight). The pH of the solution may be increased from 5 to 11 by adding ammonium hydroxide and 0.3% ammonium polyacrylate polyelectrolyte. The ceramic suspension may be dispersed using a high energy mixer, such as an attrition mill of a high shear mixer. The carbon black added to the ceramic suspension may be non-ionic aqueous nano carbon black, which may comprise 35.5% by weight of carbon black and may have a pH at or between 9 and 11. The amount of added carbon black may correspond to a ratio of carbon/yttria-stabilized zirconia of 0.17 following the transformation of PVA into carbon. The ceramic suspension may further be de-agglomerated using ultrasounds.

In various embodiments, the ceramic preparation, which may be an aqueous ceramic suspension, or slurry, may infiltrate the porosity of a carbon preform, the porosity of partially densified carbon structure, and/or other carbon structure. The porosity of a carbon structure refers to the pores, or spaces, between the carbon fibrous network. The infiltration may be conducted by immersing the carbon preform or partially densified carbon structure in the aqueous ceramic suspension. In various embodiments, infiltration may be conducted following evacuation of the pores of the carbon structure using a vacuum chamber.

In various embodiments, following introduction of the ceramic preparation within the carbon structure, the carbon structure may be dried to remove water. The ceramic content of the aqueous ceramic suspension or ceramic preparation may be selected to leave ceramic compounds of a targeted amount in the finished carbon composite. The targeted amount of dry ceramic compound, comprising yttrium oxycarbides, yttrium carbides, zirconium oxycarbides, zirconium carbides, and/or residual yttria-stabilized zirconia may range from 0.5% to 12% by weight of the finished carbon composite. That range may provide wear improvement of the carbon structure when used in applications such as brake disks, without negatively impacting the mechanical properties of the carbon composite. For example, if the amount of dry ceramic compounds comprise more than 12% by weight in a finished carbon-carbon structure, the ceramic compounds may detract from the strength of the carbon-carbon structure that is provided by the carbon matrix within the carbon composite.

Figure 3:
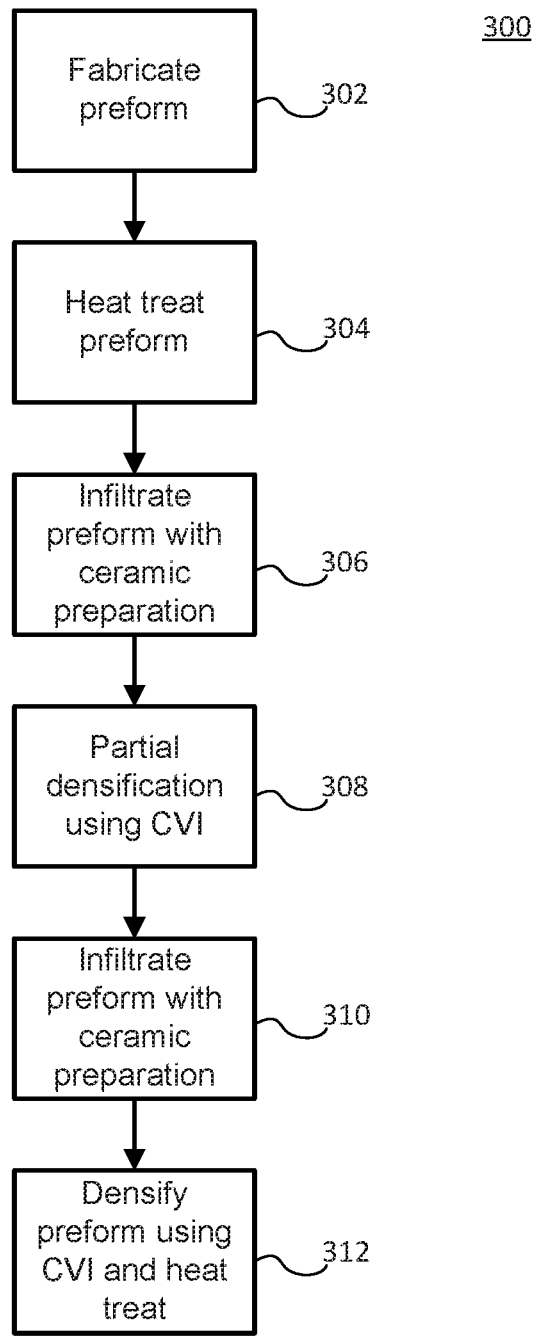
FIG. 3 illustrates a process for forming carbon components by applying ceramic material multiple times, in accordance with various embodiments.
Figure 4:
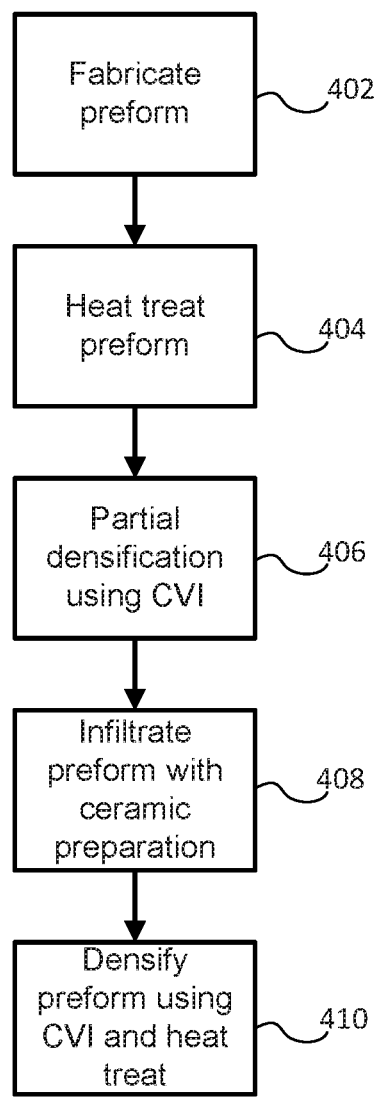
FIG. 4 illustrates a process for forming carbon components with an application of ceramic material following a partial CVI densification, in accordance with various embodiments.

In various embodiments, the ceramic particles, comprising yttrium oxides and/or zirconium oxides, in the ceramic preparation may infiltrate the carbon structure at one stage of the carbon composite fabrication, for example at the preform level, as shown in Step 206 of FIG. 2, or after a partial pyrolytic carbon densification, as shown in Step 408 of FIG. 4. In various embodiments, the ceramic particles comprising yttrium oxides and/or zirconium oxides in the ceramic preparation may infiltrate carbon structure at several stages of the carbon composite fabrication as illustrated in Steps 306 and 310 of FIG. 3. For example, the ceramic particles may be partially introduced into the preform before and after partial CVI pyrolytic densification.

Following drying of the ceramic suspension incorporated within the carbon structure, the preform or partially densified carbon structure may be heat treated to a suitable temperature in an inert environment so as to transform the added polymer or other carbon source, such as carbon black, into amorphous carbon. This step may be conducted in a separate furnace or during the ramp up to the temperature of a CVI pyrolytic carbon densification cycle. Following each addition of pyrolytic carbon to the carbon structure, the carbon structure may be heat treated in inert atmosphere to fully or partially complete the thermo-reduction of the yttrium oxides to yttrium oxycarbides and/or yttrium carbides, and the zirconium oxides to zirconium oxycarbides and/or zirconium carbides by the additional source of carbon in the form of pyrolyzed polymers and/or carbon black. In various embodiments, heat treatment may be conducted only after specific CVI densification cycles, for example, following the final CVI densification step (210, 312, and/or 410 in FIG. 2, 3, 4, respectively).

Returning to FIG. 2, after ceramic preparation infiltration, the preform may be dried (Step 208). The preform may further be densified using one or multiple CVI cycles (Step 210). Each CVI cycle may be followed by a heat treatment, as depicted in Step 210. The carbon structure may be subjected to a heat treatment between 1000° C. and 1600° C., for example.

With reference to FIG. 3, a process 300 for treating a preform and/or partially densified carbon structure is shown, in accordance with various embodiments. Process 300 is similar to process 200 of FIG. 2 in that process 300 may begin by fabricating a preform (Step 302) and heat treating the preform (Step 304). Process 300 may also end with densifying the preform using CVI and heat treating the carbon structure following each CVI cycle (Step 312) in a manner similar to that of process 200 of FIG. 2. The steps of infiltrating the preform with a ceramic preparation comprising yttrium oxides and zirconium oxides (Step 306 and Step 310) may also be similar to the infiltration of Step 206 of FIG. 2 but applied at different times, and Steps 306 and 310 may each be followed by a drying step similar to step 208 of FIG. 2. The first infiltration step (Step 306) may be applied after the fiber preform is fabricated and heat treated but before a partial CVI densification (Step 308), which may include a heat treatment step. The second infiltration step (Step 310) may be applied after partial densification using CVI (Step 308). After the second infiltration step (Step 310), the partially densified carbon structure may be dried, and then densified using CVI and heat treated (Step 312). Thus, ceramic preparation infiltration may be applied on two or more separate occasions in process 300. Additional partial CVI and/or heat treatment steps may separate the various ceramic preparation infiltration steps. The carbon structure may be infiltrated by the ceramic preparation and/or partially densified as many times as desired.

With reference to FIG. 4, a process 400 for treating a preform is shown, in accordance with various embodiments. Process 400 is similar to process 200 of FIG. 2 in that process 400 may begin with fabricating a preform (Step 402) and heat treating the preform (Step 404), and end with densifying the preform using CVI and heat treating the carbon composite (Step 410). Infiltrating the preform with the ceramic preparation (Step 408) may be similar to the infiltration step of process 200 of FIG. 2 (i.e., Step 206 of FIG. 2) but applied at different times. Infiltrating the preform with a ceramic preparation comprising yttrium oxides and zirconium oxides (Step 408) may follow after the preform is partially densified using CVI (Step 406) and heat treated following the CVI.

Benefits and other advantages have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, and any elements that may cause any benefit or advantage to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A disk brake system, comprising:
    a plurality of friction disks;
    wherein at least one friction disk in the plurality of friction disks is comprised of a carbon structure comprising a plurality of ceramic particles in the carbon structure, the plurality of ceramic particles comprising residual yttria-stabilized zirconia and at least one of zirconium oxycarbide, zirconium carbide, yttrium oxycarbide, or yttrium carbide.

2. The disk brake system of claim 1, wherein the plurality of ceramic particles comprise, by weight, 0.5% to 12% of the carbon structure.

3. The disk brake system of claim 1, wherein each ceramic particle of the plurality of ceramic particles comprises a size of less than 500 nanometers.

* * * * *